(12) United States Patent
Blanc et al.

(10) Patent No.: US 7,394,264 B2
(45) Date of Patent: Jul. 1, 2008

(54) DEVICE FOR NON-DISSIPATIVE MEASUREMENT OF THE CURRENT IN AN INDUCTOR

(75) Inventors: Flavien Blanc, Valence (FR); Christophe Taurand, Valence (FR)

(73) Assignee: Thales (FR)

( * ) Notice: Subject to any disclaimer, the term of this patent is extended or adjusted under 35 U.S.C. 154(b) by 201 days.

(21) Appl. No.: 10/576,763

(22) PCT Filed: Oct. 6, 2004

(86) PCT No.: PCT/EP2004/052447

§ 371 (c)(1),
(2), (4) Date: Apr. 21, 2006

(87) PCT Pub. No.: WO2005/038472

PCT Pub. Date: Apr. 28, 2005

(65) Prior Publication Data

US 2007/0075711 A1    Apr. 5, 2007

(30) Foreign Application Priority Data

Oct. 21, 2003  (FR) .................................. 03 12294

(51) Int. Cl.
*G01R 27/08* (2006.01)
*G05F 1/613* (2006.01)
*H02H 3/00* (2006.01)
*H02H 7/00* (2006.01)
*H02H 9/02* (2006.01)

(52) U.S. Cl. .................. 324/721; 324/713; 323/224; 361/101

(58) Field of Classification Search ............... 324/721, 324/713
See application file for complete search history.

(56) References Cited

U.S. PATENT DOCUMENTS

| 4,910,455 A | 3/1990 | Nadd |
| 5,501,517 A * | 3/1996 | Kiuchi ....................... 361/101 |
| 6,222,356 B1 * | 4/2001 | Taghizadeh-Kaschani .. 323/288 |
| 6,275,016 B1 * | 8/2001 | Ivanov ........................ 323/224 |
| 6,377,034 B1 * | 4/2002 | Ivanov ........................ 323/287 |
| 6,469,481 B1 * | 10/2002 | Tateishi ..................... 323/282 |
| 2003/0071636 A1 * | 4/2003 | Liebler ...................... 324/630 |
| 2005/0179423 A1 * | 8/2005 | Xing .......................... 323/282 |
| 2007/0241727 A1 * | 10/2007 | Luo et al. ................... 323/272 |

* cited by examiner

*Primary Examiner*—Diego Gutierrez
*Assistant Examiner*—Benjamin M Baldridge
(74) *Attorney, Agent, or Firm*—Lowe Hauptman Ham & Berner, LLP

(57) ABSTRACT

The invention relates to a device for measuring current in an inductor and being connected in parallel with said inductor. The device includes a network in parallel with the inductor and connected to the terminals A and B comprising a resistor R2 in series with a resistor R1 in parallel with a capacitor C1; a voltage offset circuit having a DC voltage generator E connected in parallel with an offset resistor (Roffset) in series with two parallel resistors R3 and R4, the positive pole of the voltage source being connected to terminal B of the inductor; a temperature compensation circuit comprising a current source controlled as a function of the temperature, one of the two terminals of the current source being connected to the negative pole of the generator E, the other terminal of the current source being connected to different points of the measurement device.

8 Claims, 4 Drawing Sheets

_US 7,394,264 B2_

DEVICE FOR NON-DISSIPATIVE MEASUREMENT OF THE CURRENT IN AN INDUCTOR

FIELD OF THE INVENTION

The invention relates to an inexpensive and compact non-dissipative measurement device for the current flowing through an inductor inserted into an electrical or electronic device.

BACKGROUND OF THE INVENTION

In certain electronic applications it is necessary to measure the value of the current in the inductors with good accuracy and while disturbing as little as possible the device in which the inductor is inserted. We may cite for example the measurement of the current in the inductors of switched mode power supplies, among other things, voltage step-down or step-up switched mode serial choppers (respectively known as "buck converters" and "boost converters").

The conventional method which is most used consists in placing a measurement shunt in series with the inductor, thereby making it possible to obtain the image of the current in the inductor by measuring the voltage across the terminals of the shunt. This solution has the advantage of being simple to implement, on the other hand it has a major drawback. Specifically, the power dissipated in the shunt contributes to a degradation in the overall efficiency of the converter, which is not always acceptable, this being all the more true when the output voltage of the energy conversion device is low. To avoid this constraint, a non-dissipative solution for measuring current, presented in FIG. 1, is used.

FIG. 1 shows a diagram of a device 10 for measuring the current I passing through an inductor 12. The inductor 12 is represented by its equivalent diagram comprising a pure reactive part, i.e. the inductive part L in series with a resistor RL. The inductor comprises a terminal A and a terminal B.

The inexpensive and very non-dissipative measurement device 10 is placed in parallel with the terminals A and B of the inductor 12. The measurement device 10 comprises a resistor R2 in series with a resistor R1 in parallel with a capacitor C1, the resistor R2 being connected to the terminal A, the resistor R1 to the terminal B.

The aim of this arrangement of the state of the art is to obtain a voltage across the terminals of the capacitor C1 proportional to the voltage across the terminals of the resistor RL of the inductor 12 hence proportional to the current I in the inductor 12 (or in the inductor L). The currents in the resistors R2 and R1 are negligible compared with the current I in the inductor 12.

To size the elements of the device, it is important to comply with the following constraint:

$$\frac{L}{RL} = \frac{R1 \cdot R2}{R1 + R2} \times C1 \qquad \text{equation (1)}$$

If the condition expressed by equation (1) is satisfied, $V_{C1}$ is the image of the current in the inductor. The voltage $V_{C1}$ across the terminals of C1 is given by the following relation:

$$V_{C1} = \left(\frac{R1 \cdot RL}{R1 + R2}\right) \cdot I \qquad \text{equation (2)}$$

The device of FIG. 1 therefore makes it possible to obtain the image of a current passing through an inductor on condition that the value of the intrinsic resistance RL of the inductor is known.

It may be pointed out that the image of the current is given by an equation of the type: $V_{C1}(I) = a \cdot I$ with "a" the proportionality coefficient.

For certain applications, it is necessary that the measurement exhibit an offset voltage, that is to say that contrary to the above equation (2), when the current I is zero the voltage $V_{C1}$ is not zero. The equation which conveys this behavior is of the form $V_{C1}(I) = a \cdot I + b$ with:

"a" the proportionality coefficient and "b" the ordinate at the origin (offset voltage in our case).

To produce this offset in the measurement, it suffices to join an additional arrangement to the device of FIG. 1.

FIG. 2 shows a device for measuring the current I in the inductor 12 with a voltage offset Voffset.

In the device for measuring the current of FIG. 2, the voltage which is the image of the current in the inductor is no longer $V_{C1}$, as in the device of FIG. 1, but becomes the voltage Vmes.

The measurement circuit of FIG. 2 furthermore comprises elements of FIG. 1, an offset circuit 14 having a DC voltage Vout generator E connected in parallel, with an offset resistor Roffset in series with two resistors in parallel R3 and R4. The positive pole of the generator being connected to the common point of the two resistors R3 and R4 and to the terminal B of the inductor 12, the negative pole of the generator being connected to the resistor Roffset. The voltage generator E may be the output capacitor of a converter, this being the case for a Buck type chopper, for example.

It is also possible to place a capacitor C'1 in parallel with R3 and R4 so as to balance the impedances on the two branches of the measurement device.

The voltage Vmes is measured between the common point ca between the two resistors R2 and R1 and the common point cb between the resistor Roffset and the two resistors R3 and R4 in parallel.

The expression for Vmes relating to the device of FIG. 2 may be written:

$$Vmes = \left(\frac{R1 \cdot RL}{R1 + R2}\right) \cdot I + Vout \cdot \left(1 - \frac{Roffset}{\frac{R3 \cdot R4}{R3 + R4} + Roffset}\right) \qquad \text{equation (3)}$$

The voltage Vout being constant, the voltage Voffset is therefore also constant, the equation obtained is therefore of the form: Vmes(I) = a·I + b, with:

$$a = \left(\frac{R1 \cdot RL}{R1 + R2}\right) \text{ and } b = Vout \cdot \left(1 - \frac{Roffset}{\frac{R3 \cdot R4}{R3 + R4} + Roffset}\right)$$

This type of measurement is used in devices such as the switched mode converters of power electronics, for which it is necessary to limit the current passing through the inductors. For this purpose, the measurement voltage Vmes is compared, with the aid of a threshold-based comparator, with a threshold voltage Vthreshold corresponding to a maximum current Imax.

However the device of the prior art represented in FIG. 2, has a major drawback since the value of the resistance RL of the inductor depends on the temperature to which it is subjected, the current measurement which is obtained therefore exhibits an error related to the temperature. The consequence is that the measurement of the current in the inductor and therefore the limitation of current Ilim depends on the temperature.

FIG. 3 shows a curve of variation of the limitation current Ilim as a function of the temperature T of a current limiting circuit comprising a threshold-based comparator and the measurement device of FIG. 2. The variation in the limitation current as a function of the temperature is 60% between −40° C and 100° C. Such a scatter in the value of the limiting current gives rise to an oversizing of the power circuit so that it can withstand the limiting current at low temperature, this representing a major drawback.

SUMMARY OF THE INVENTION

In order to alleviate the drawbacks of the devices for measuring current of the prior art, the invention proposes a device for measuring current in an inductor, which device is intended to be connected in parallel with said inductor, comprising two terminals A and B, characterized in that it comprises:

a network in parallel with the inductor and connected to the terminals A and B having a resistor R2 in series with a resistor R1 in parallel with a capacitor C1;

a voltage offset circuit having a DC voltage generator E connected in parallel with an offset resistor (Roffset) in series with two resistors in parallel R3 and R4, the positive pole of the generator being connected to the common point of the two resistors R3 and R4 and to the common point of the resistor R1 and the capacitor C1 of the network intended to be connected to one of the two terminals of the inductor, the negative pole of the generator E being connected to the offset resistor;

a temperature compensation circuit comprising a current source controlled as a function of the temperature, one of the two terminals of the current source being connected to the negative pole of the generator E, the other terminal of the current source being connected to different points of the measurement device according to the direction of variation of the current of the source as a function of the temperature;

and in that the measurement of voltage Vmes, the image of the current in the inductor, is performed between the common point of the resistors R1, R2 of the network and the common point of the offset resistor and of the two resistors R3 and R4.

It is moreover necessary to satisfy the condition expressed by the following equation:

$$\frac{L}{RL} = \frac{R1 \times R2}{R1 + R2} \times C1,$$

considering the inductor as represented by an equivalent diagram comprising an inductive part L and a resistor part RL in series, so that the voltage $V_{C1}$ across the terminals of the capacitor C1 is independent of the voltage $V_L$ across the terminals of the inductor.

In an embodiment of the device for measuring current according to the invention, the variation in current of the current source as a function of the temperature being effected in a first direction, the other terminal of the current source is connected to the point of connection between the resistors R1 and R2 of the network.

In another embodiment of said device, the variation in current of the current source as a function of the temperature being effected in a second direction, the other terminal of the current source is connected to the point of connection between the resistors R3, R4 and the offset resistor (Roffset) of the compensation circuit.

FIGS. 4b, 4c and 4d show various representations of the current source of the temperature compensation circuit.

The current source controlled as a function of temperature θ may be represented by:

an ideal model of current source Iperf(θ), represented in FIG. 4b;

an equivalent Norton model Inor(θ), represented in FIG. 4c, comprising a perfect current source varying as a function of temperature in parallel with a resistor Rnor;

an equivalent Thevenin model, represented in FIG. 4d, comprising a voltage source Eth(θ) varying as a function of temperature in series with a resistor Rth.

According to the direction of variation of the current of the current source for the temperature compensation, the temperature compensation circuit will be linked by one of these two terminals, either to the common point between the two resistors R1 and R2 of the network, or to the point of connection between the resistors R3, R4 and the offset resistor (Roffset) of the compensation circuit and by the other terminal to the negative pole of the generator E. In the latter case the temperature compensation circuit is in parallel with the offset resistor (Roffset).

This device makes it possible, by injection of current controlled as a function of temperature, to obtain a voltage (Vmes) which is the image of the current in the inductor regardless of the temperature of the latter.

The current source of the temperature compensation circuit may be embodied in various ways, for example on the basis of voltages across the terminals of networks of electrical or electronic components among which we may cite:

temperature dependent variable resistors (platinum resistors, silicon resistor, for example resistor known commercially as KTY from the manufacturer "INFINEON" . . . );

diodes whose threshold voltage varies with temperature (−2 mV/° C.);

or any other electronic circuit providing a temperature dependent voltage or current (integrated temperature sensor such as the AD 590 from the manufacturer "Analog Device" . . . ).

A capacitor C'1 may be added in parallel with R3 and R4 so as to improve the operation of the device and increase its precision.

BRIEF DESCRIPTION OF DRAWINGS

The invention will be better understood with the aid of a nonlimiting exemplary embodiment of a measurement device according to the invention with reference to the figures in which.

DETAILED DESCRIPTION OF EMBODIMENTS

Figure 4A:
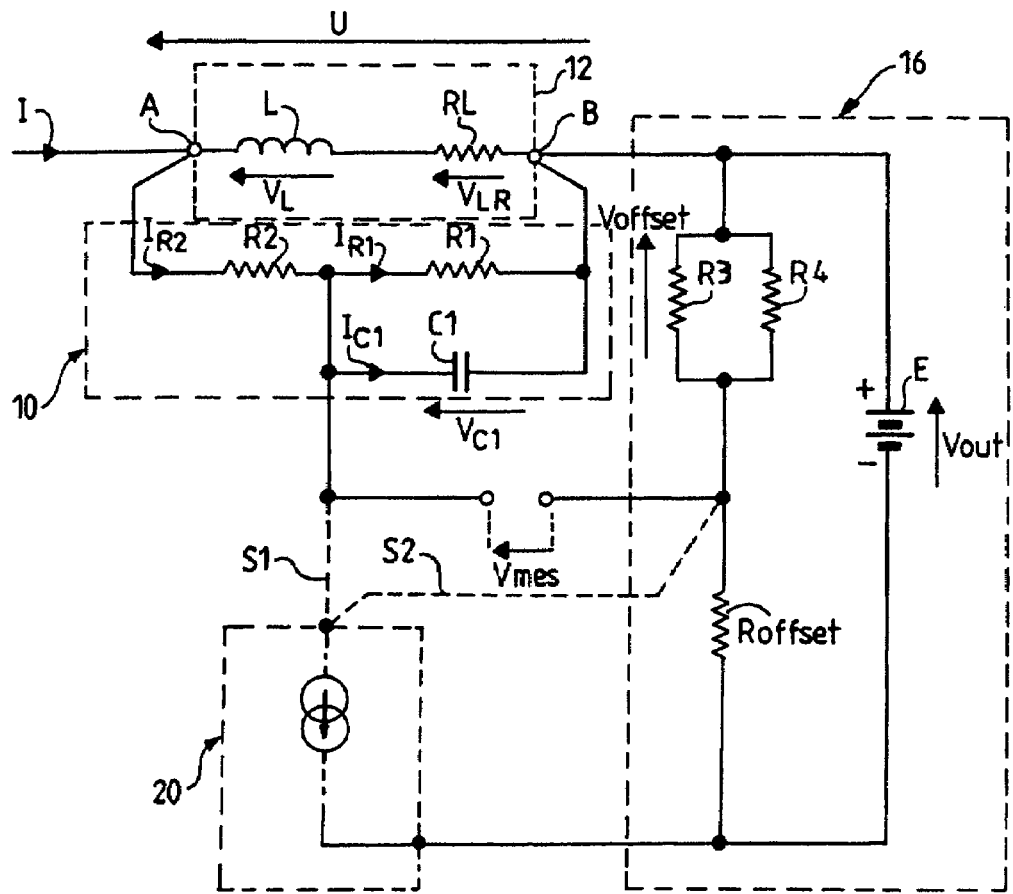
FIG. 4a represents a device for measuring current in an inductor in a general case of the invention with a voltage offset.

The diagram of FIG. 4a shows a device for measuring current in an inductor in a general case of the invention with a voltage offset.

FIG. 4a shows:
  the inductor 12 represented by its equivalent diagram comprising a pure reactive part L, in series with a resistor RL;
  a device for measuring current in the inductor 12, according to the invention, connected in parallel with the inductor comprising the two terminals A and B.

Figure 1:
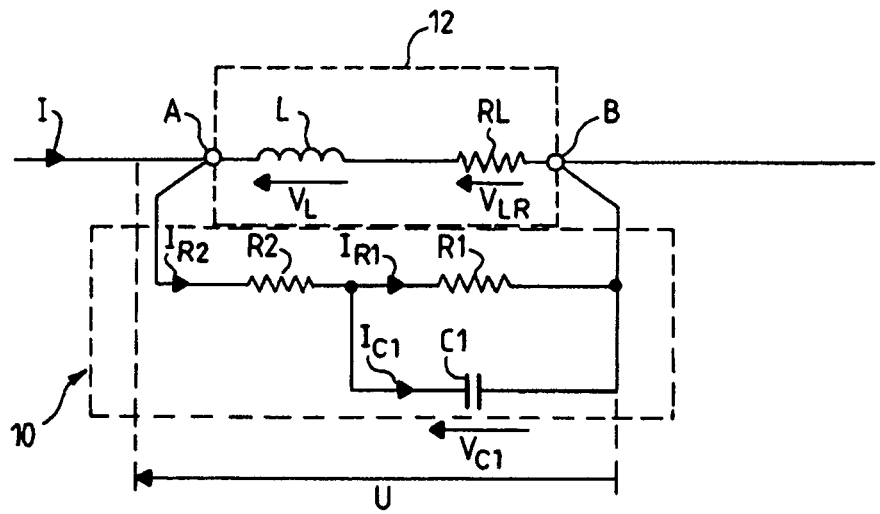
FIG. 1, already described, represents a device for measurement of the state of the art of the current passing through an inductor.
Figure 2:
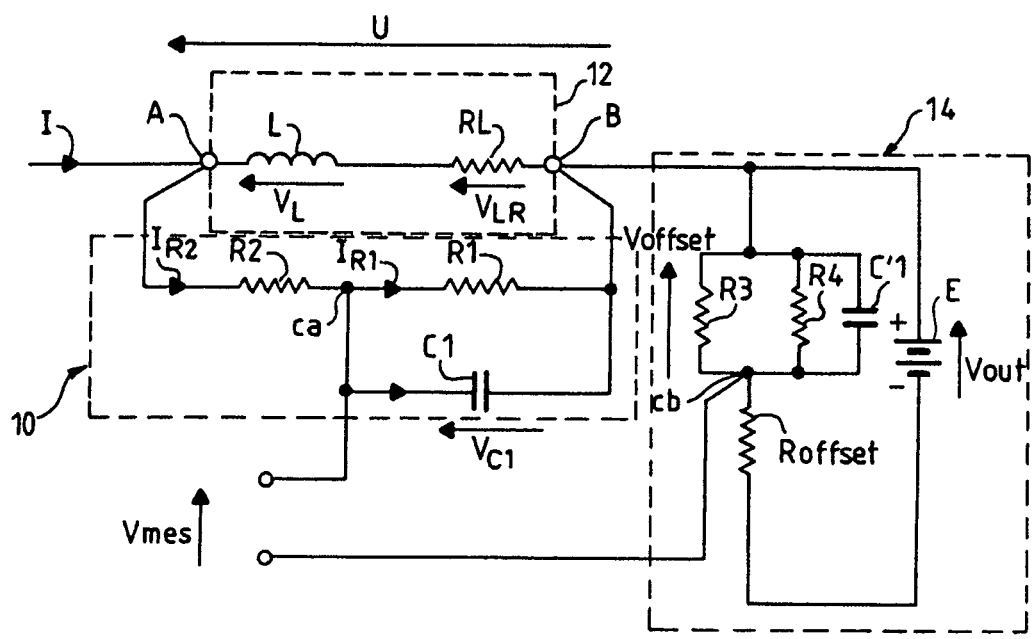
FIG. 2, already described, represents a device for measuring the current in the inductor of FIG. 1, with a voltage offset.
Figure 3:
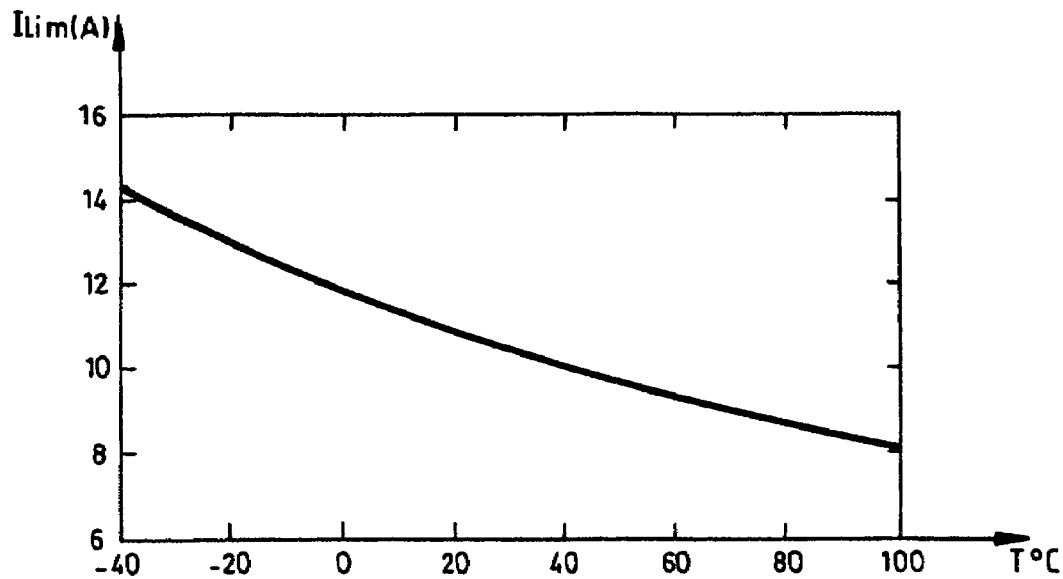
FIG. 3, already described, represents a curve of variation of the limiting current as a function of the temperature of a current limiting circuit using the measurement device of FIG. 2.
Figures 4B, 4C, 4D:
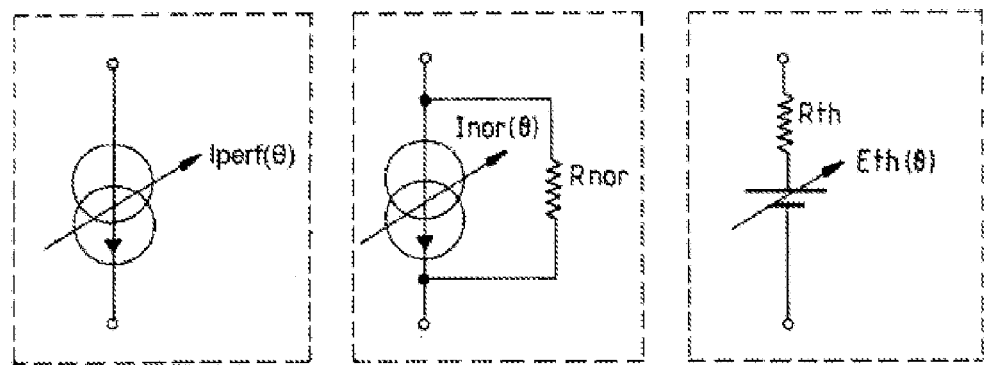
FIGS. 4b, 4c and 4d already described show various representations of the current source of the temperature compensation circuit.

The device of FIG. 4a comprises:
  the network 10 as represented in FIG. 2 (or the measurement device of the state of the art of FIG. 1) in parallel with the inductor 12 and connected to the terminals A and B having the resistor R2 in series with the resistor R1 in parallel with the capacitor C1;
  a voltage offset circuit 16 having the generator E of DC voltage Vout connected in parallel with the offset resistor Roffset in series with the two resistors in parallel R3 and R4 and to the common point of the resistor R1 and the capacitor C1 linked to the terminal B of the inductor 12. The negative pole of the generator is connected to the offset resistor Roffset;
  a temperature compensation circuit 20 comprising a current source varying as a function of temperature possibly being represented by a perfect current source varying as a function of temperature Iperf(θ) (FIG. 4b) or by an equivalent Norton model Inor(θ) in parallel with a resistor Rnor (FIG. 4c), or an equivalent Thevenin model (FIG. 4d) comprising a voltage source varying as a function of temperature Eth(θ) in series with a resistor Rth.

According to the direction of variation of the current of the temperature compensation source (current generator), the temperature compensation circuit will be connected either, for a first direction of variation of the current, by one of these two terminals, to the common point between the two resistors R1 and R2 of the network 10 by the connection S1 represented as a discontinuous line in FIG. 4a, or, for the second direction of variation of current, connected to the common point of the offset resistor and of the two resistors R3 and R4 by the connection S2 represented as a discontinuous line (i.e. in this second case in parallel with the offset resistor Roffset).

The capacitor C'1 may be added in parallel with the resistors R3 and R4 so as to improve the operation of the device and increase its precision.

The voltage measurement Vmes which is the image of the current I in the inductor 12 is performed between the common point between the resistors R1, R2 of the network and the common point between the offset resistor Roffset and the two resistors R3 and R4.

Figure 5:
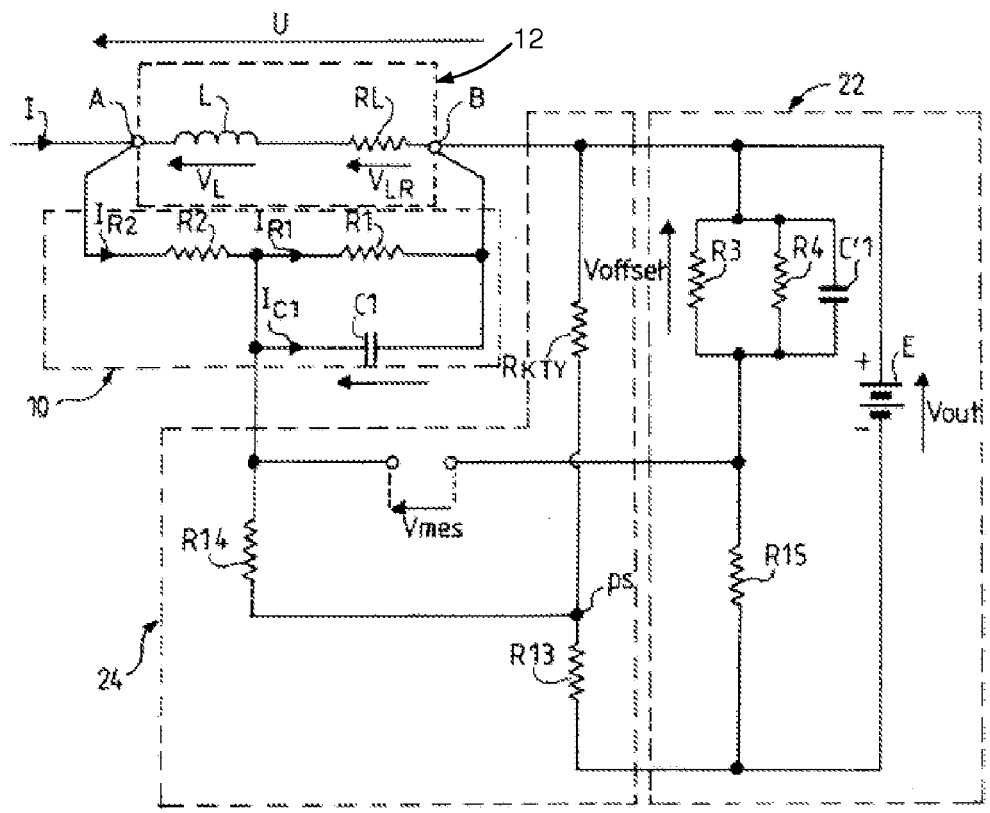
FIG. 5 shows an embodiment by way of example of the device for measuring current in an inductor, according to the invention.

FIG. 5 shows a first embodiment of the device for measuring current in an inductor, according to the invention.

The device comprises:
  the network 10 as represented in FIG. 2 in parallel with the inductor 12 and connected to the terminals A and B having the resistor R2 in series with the resistor R1 in parallel with the capacitor C1,
  a voltage offset circuit 22 comprising the generator E connected in parallel with an offset resistor R15 in series with two resistors R3 and R4 in parallel. The positive pole of the generator E is connected to the common point of the two resistors R3 and R4 on the side of these resistors and to the common point of the resistor R1 and the capacitor C1 linked to the terminal B of the inductor 12, the negative pole of the generator E being linked to the offset resistor R15;
  a temperature compensation circuit 24 comprising a resistor R14 linked by one of these two terminals to the common point between the two resistors R1 and R2 of the network and by the other terminal to an output ps of a divider bridge comprising a resistor R13 in series with a thermistor RKTY (ref.: KTY 13-6 from INFINEON), the divider bridge being connected, on the side of the thermistor RKTY to the positive pole of the generator E and on the side of the resistor R13 to the negative pole of the generator E.

The voltage source Eth for temperature compensation (FIG. 4d) is obtained in the case of the embodiment of FIG. 5 through the voltage of the common point between the resistors RKTY and R13.

A capacitor C'1 is connected in parallel with R3 and R4 so as to improve the operation of the device and increase its precision.

The voltage measurement Vmes which is the image of the current I in the inductor 12 is performed between the common point of the resistors R15, R3, R4 and the common point of the resistors R14, R1, R2.

We shall hereinbelow express the relations existing between the various elements of the device according to the invention represented in FIG. 5.

The resistance RL represents the intrinsic resistance of the inductor 12. The resistance RL varies with temperature and with no compensation circuit an error of measurement of the current in the inductor occurs.

We shall consider, by way of example, the case of the use of the measurement device according to the invention of FIG. 5 in a switched mode voltage converter operating with a switching frequency F, having a current limiting circuit (not represented in the figures). The limiting circuit essentially comprises a threshold-based comparator receiving on the one hand the voltage Vmes which is the image of the current in the inductor 12 and on the other hand a threshold voltage Vcomp representing a maximum current not to be exceeded. In the exemplary embodiment of FIG. 5, the values of the components are:

RL0=8 mΩ for an ambient temperature T0=25° C.

The resistance of the inductor RL(T) as a function of temperature is given by $$RL(T)=RL0.[1+0.0038(T-T0)].$$

The diagram of FIG. 5 allows thermal compensation of the measurement of the current to obtain a maximum current limitation independent of temperature. To this end use is made of an RKTY thermistor based on silicon the resistance of which varies in a substantially linear manner as a function of temperature.

RKTY0=20000Ω,

RKTY0 for an ambient temperature of T0=25° C., $RKTY(T)=RKTY0.[1+7.8810^{-3}.(T-T0)+19.3710^{-6}.(T-T0)^2].$ The system will be sized between the two extreme temperatures Th and Tb. This is the temperature of the inductor at full power, therefore comprising the external ambient temperature added to the rise in temperature internal to the box in which the inductor may be located and that of the inductor.

The current measurement Vmes is applied to an input of the current comparator circuit (not represented in the figures). The maximum threshold Vcomp of the current Vmes corresponding to a limiting current Imax is applied to the other input of the comparator. For example in this embodiment:

Vcomp=75 mV

The voltage Voffset to be applied to the input of the comparator, when the current is zero, is:

Voffset=3 mV

The maximum output current Imax from the converter (mean current in the inductor) is:

Imax=8 A, for a nominal current

As was stated previously, to obtain a correct measurement of current in the inductor, the following relation must be complied with:

$$R_{1P2} \cdot C1 = \frac{L}{RL}$$

$R_{1P2}$ being the resistance equivalent to R1 and R2 in parallel.

As RL varies with temperature, in practise, the mid value RImed may be chosen.

R13 will be chosen a priori to obtain a bridge voltage (RKTY, R13) which changes significantly with temperature while limiting the current in RKTY so as to avoid self-heating.

It is therefore possible to express the relation linking Vmes and the current I in the inductor as follows:

$$Vmes = \frac{R2 \cdot R14}{(R1+R2) \cdot (R_{1P2}+R14)} \cdot RL \cdot I \cdot$$
$$+ Vout \cdot \left( \frac{R_{1P2}}{R_{1P2}+R15} - \frac{RKTY}{RKTY+R13} \cdot \frac{R_{1P2}}{P_{1P2}+R14} \right)$$

with RL(T) resistance of the inductor as a function of temperature, with RKTY(T) temperature dependent variable resistance.

The calculation of the limiting current Ilim adjusted by the threshold voltage on the comparator is given by the expression:

$$IlimComp(T) = \frac{Vcomp + Vout \cdot \left( \frac{R_{1P2}}{R_{1P2}+R14} \cdot \frac{RKTY(T)}{RKTY(T)+R13} - \frac{R_{1P2}}{R_{1P2}+R15} \right)}{\frac{R2}{R2+R1} \cdot \frac{R14}{R14+R_{1P2}} \cdot RL(T)}$$

Figure 6:
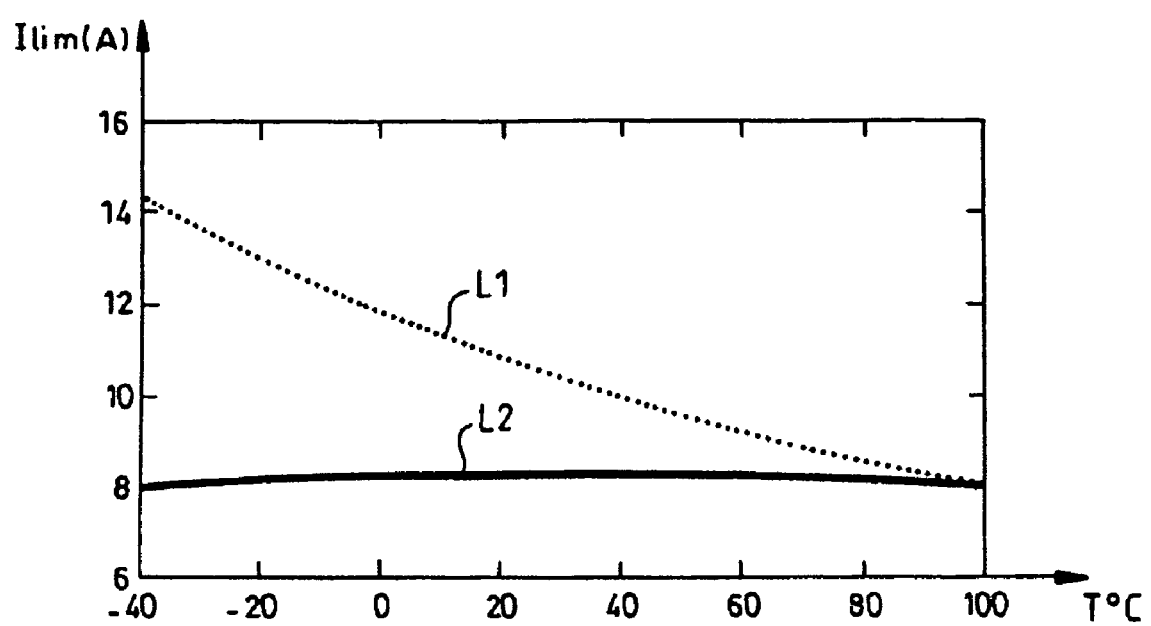
FIG. 6 shows by way of comparison the variations in the limiting current as a function of temperature with the device according to the invention (continuous plot) and without the device (discontinuous plot).

The curves of FIG. 6 show the variations in the limiting current Ilim as a function of temperature T in degrees, the curve L1 showing this variation in the case of a system not equipped with the device of the invention, curve L2 in the case of a system equipped with the measurement device according to the invention. These curves reveal the effectiveness of the measurement device according to the invention, the variation in limiting current with the temperature-compensated device according to the invention being almost zero.

The invention claimed is:

1. A device for measuring current in an inductor, which device is intended to be connected in parallel with said inductor, having two terminals A and B, comprising:

a network in parallel with the inductor and connected to the terminals A and B having a resistor R2 in series with the combination of a resistor R1 in parallel with a capacitor C1;

a voltage offset circuit having a DC voltage generator E connected in parallel with an offset resistor in series with two resistors in parallel R3 and R4, the positive pole of the generator being connected to the common point of the two resistors R3 and R4 and to the common point of the resistor R1 and the capacitor C1 of the network intended to be connected to one of the two terminals of the inductor, the negative pole of the generator E being connected to the offset resistor;

a temperature compensation circuit comprising a current source controlled as a function of the temperature, one of the two terminals of the current source being connected to the negative pole of the generator E, the other terminal of the current source being connected to different points of the measurement device according to the direction of variation of the current of the source as a function of the temperature;

and in that the measurement of voltage Vmes, the image of the current in the inductor, is performed between the common point of the resistors R1, R2 of the network and the common point of the offset resistor and of the two resistors R3 and R4.

2. Device for measuring current according to claim 1, wherein the inductor being equivalent to a pure inductive part L in series with a resistive part RL the network in parallel with the inductor satisfying the condition expressed by the relation:

$$\frac{L}{RL} = \frac{R1 \times R2}{R1+R2} \times C1$$

so that the voltage $V_{C1}$ across the terminals of the capacitor C1 is independent of the voltage $V_L$ across the terminals of the inductor.

3. The device for measuring current according to claim 1, wherein the variation in current of the current source as a function of the temperature being effected in a first direction, the other terminal of the current source is connected to the point of connection between the resistors R1 and R2 of the network.

4. The device for measuring current according to claim 1, wherein the variation in current of the current source as a function of the temperature being effected in a second direction, the other terminal of the current source is connected to the point of connection between the resistors R3, R4 and the offset resistor of the compensation circuit.

5. The device for measuring current according to claim 1, wherein the current source of the temperature compensation circuit is one of:

temperature dependent variable resistors;

diodes whose threshold voltage varies with temperature ($-2$ mV/° C.); and an electronic circuit providing a temperature dependent voltage or current.

6. The device for measuring current according to claim 1, comprising:

the network in parallel with the inductor and connected to the terminals A and B having the resistor R2 in series with the resistor R1 in parallel with the capacitor C1, a voltage offset circuit comprising the generator E connected in parallel with an offset resistor R15 in series with two resistors R3 and R4 in parallel, the positive pole of the generator E being connected to the common point of the two resistors R3 and R4 on the side of these resistors and to the common point of the resistor R1 and the capacitor C1 linked to the terminal B of the inductor 12, the negative pole of the generator E being linked to the offset resistor R15;

a temperature compensation circuit comprising a resistor R14 linked by one of these two terminals to the common point between the two resistors R1 and R2 of the network and by the other terminal to an output ps of a divider bridge comprising a resistor R13 in series with a thermistor RKTY, the divider bridge being connected, on the side of the thermistor RKTY to the positive pole of the generator E and on the side of the resistor R13 to the negative pole of the generator E.

7. The device for measuring current according to claim 6, wherein the thermistor RKTY is based on silicon, the resistance of which varies in a substantially linear manner as a function of the temperature.

8. The device for measuring current according to claim 1, comprising a capacitor C1' in parallel with the resistors R3 and R4.

* * * * *